United States Patent [19]

Vassiliou

[11] Patent Number: 4,987,044
[45] Date of Patent: Jan. 22, 1991

[54] METHOD AND APPARATUS FOR MAINTAINING DESIRED EXPOSURE LEVELS

[75] Inventor: Eustathios Vassiliou, Newark, Del.

[73] Assignee: E. I. du Pont de Nemours and Company, Wilmington, Del.

[21] Appl. No.: 359,806

[22] Filed: May 31, 1989

[51] Int. Cl.$^5$ .................. G03G 13/04; G03C 5/04
[52] U.S. Cl. .......................... 430/20; 430/31; 430/39; 430/270; 430/494; 430/945; 350/6.6; 219/121.74; 264/1.4; 427/53.1; 427/54.1
[58] Field of Search .............. 350/6.6; 430/20, 31, 430/39, 270, 499, 945; 219/121.74

[56] References Cited

U.S. PATENT DOCUMENTS

| | | | |
|---|---|---|---|
| 2,775,758 | 12/1956 | Munz | 343/17 |
| 3,364,497 | 1/1968 | MacAdam | 219/121.74 X |
| 3,743,777 | 7/1973 | Hanus | 219/121.74 X |
| 4,575,330 | 3/1986 | Hull | 425/162 |
| 4,752,498 | 6/1988 | Fudim | 427/54.1 |

FOREIGN PATENT DOCUMENTS

| | | | |
|---|---|---|---|
| 0250121 | 2/1987 | European Pat. Off. . | |
| 0249770 | 9/1987 | German Democratic Rep. | 430/494 |
| 54-150140 | 11/1979 | Japan | 350/6.6 |
| 57-179818 | 11/1982 | Japan | 350/6.6 |
| 2215859 | 9/1989 | United Kingdom | 350/6.6 |

OTHER PUBLICATIONS

Kodama–American Institute of Physics–"Automatic Method For Fabricating a Three-Dimensional Plastic Model L with Photo-Hardening Polymer", Herbert-Image Technology-Solid Object Generation.
Herbert–The Society for Imaging Science and Technology–"A Review of 3D Solid Object Generation".

Primary Examiner—Roland E. Martin

[57] ABSTRACT

A radiation beam used for selectively exposing a surface is moved in a helical path by means of two oscillating mirrors vibrating about axes that are mutually perpendicular. By maintaining a constant product for oscillating frequency and rotational oscillatory mirror deflection, the level of exposure can be made substantially constant.

15 Claims, 5 Drawing Sheets

METHOD AND APPARATUS FOR MAINTAINING DESIRED EXPOSURE LEVELS

1. FIELD OF THE INVENTION

This invention relates to a method and apparatus for controlling the exposure at the exposed portions of an image. It more specifically refers to the production of three-dimensional objects by photocuring, and more particularly to the controlled use of relatively high power beam radiation sources such as high-power lasers to accomplish said production directly at a relatively high rate and accuracy.

2. BACKGROUND OF THE INVENTION

Beam radiation sources such as lasers are very useful in producing images by utilizing different types of scanning over the surface to be imaged. Although some types of energy, (E.G. electron beams) may be deflected scanning by electric or magnetic fields, laser beam scanning is typically accomplished by electromechanical means, such as sets of mirrors driven by servomotors, which in turn are controlled by suitable computer devices. These electromechanical means operate relatively slowly as compared with their electrically or magnetically controlled counterparts.

Three dimensional imaging has recently become of great importance. The problems encountered in three dimensional imaging are considerably more complex than those presented in two dimensional imaging, due to the additional necessity of accurately controlling the exposed depth, and due to the multilayered structure of three dimensional models.

Many systems for production of three-dimensional modeling by photocuring have been proposed. European patent application (Publication No. 250,121 filed by Scitex Corporation, Ltd. on June 6, 1987), and incorporated herein by reference, provides a good summary of documents pertinent to this art area, including various approaches attributed to Hull, Kodama, and Herbert. Additional background is described in U.S. Pat. No. 4,752,498 issued to Fudim on June 21, 1988, which is also incorporated herein by reference.

These approaches relate to the formation of solid sectors of three-dimensional objects in steps by sequential irradiation of areas or volumes sought to be solidified. Various masking techniques are described as well as the use of direct laser writing, i.e., exposing a photocurable composition with a laser beam according to a desired pattern and building a three-dimensional model layer by layer. They utilize raster scanning, which however has many disadvantages, such as necessity to scan the whole field even if the object to be produced is only a very small part of the total volume, considerably increased amount of data to be stored in most cases, overall more difficult manipulation of the stored data, and the necessity to convert CAD-based vector data to raster data.

An alternative way of scanning would be vector scanning, where only the areas corresponding to the shape of the rigid object have to be scanned, the amount of data to be stored is smaller, the data can be manipulated more easily, and "more than 90% of the CAD based machines generate and utilize vector data" (Lasers & Optronics, Jan. 1989, Vol. 8, No. 1, pg. 56). Vector scanning, despite its advantages, introduces problems related to the inertia of the optical members, such as mirrors, of the available deflection systems for the currently most convenient radiation sources, such as lasers. Since these systems are electromechanical in nature, there is a period of acceleration involved in reaching any desired beam velocity. This unavoidable non-uniformity in velocity results in unacceptable thickness variations in the exposed photocurable composition. Especially in the case of portions of layers having no immediate previous levels of exposure at the high intensity it becomes necessary to use high beam velocities, and therefore, longer acceleration times, which in turn result in thickness non-uniformity in the exposed composition. Our co-pending application IM-0178, incorporated herein by reference, describes an improved method and apparatus to utilize more effectively vector scanning and avoid its previously experienced disadvantages. However, even in this case, the mechanisms employed are rather complicated and expensive.

It is therefore an object of the present invention to provide a simple and inexpensive method and apparatus for direct writing on a surface with radiation in the form of a beam, and particularly in the form of a laser beam by an improved way of scanning, where the exposed portions of the surface receive a controlled level of exposure, which level can be caused to remain substantially constant.

It is a further object of the present invention to provide a simple and inexpensive method and apparatus for direct laser writing onto an unexposed photocurable composition by the aforementioned improved way of scanning, and forming sequential three-dimensional model layers of precisely-controlled depth and resolution.

SUMMARY OF THE INVENTION

This invention relates to a method and apparatus for controlling the exposure at the exposed portions of an image. It more specifically refers a method for subjecting predetermined portions of a surface to desired exposure levels with a beam of radiation, comprising the steps of:

A method for subjecting predetermined portions of a surface to desired exposure levels with a beam of radiation, comprising the steps of: deflecting said beam towards said surface through a set of a first mirror and a second mirror, the first mirror having a first rotational axis, the second mirror having a second rotational axis; oscillating said first mirror about said first axis at a desired frequency and effective amplitude with a substantially sinusoidal motion, and oscillating said second mirror about said second axis with a substantially sinusoidal motion at substantially said desired frequency and effective amplitude as employed for said first mirror, so that both mirrors are characterized by a common frequency value and a common effective amplitude value; maintaining a substantially 90 degree phase difference between the sinusoidal motion of the first mirror and the sinusoidal motion of the second mirror; tracing said surface with said beam in a spiral path by changing gradually and simultaneously the common value of the effective amplitude and the common value of the frequency inversely, so that the product of the two values is controlled so as to yield a desired exposure level on the traced surface when the beam is on; and turning the beam off and on at predetermined angular positions in order to subject said predetermined portions of said surface to a desired exposure level.

It also refers to an apparatus for subjecting predetermined portions of a surface to desired exposure level with a beam of radiation comprising: a radiation source for providing a radiation beam; a set of a first mirror and a second mirror for deflecting said beam towards said surface, the first mirror having a first rotational axis, and the second mirror having a second rotational axis; a switch for controlling said radiation beam, the switch disposed between the radiation source and said set of mirrors; a set of a first and a second oscillator means, the first oscillator means connected to the first mirror and the second oscillator means connected to the second mirror; frequency generator means connected to the first and the second pulsating means for providing each of the first and the second mirror through the first and the second pulsating means, respectively, with a sinusoidal motion having a common frequency and a common effective amplitude, the sinusoidal motion of the first mirror and the sinusoidal motion of the second mirror having a phase difference of substantially 90 degrees; and computer means connected to and controlling both the frequency generator means and said switch, so that the beam traces the surface in a spiral path characterized by a spiral step, by gradual and simultaneous changes in the common value of the effective amplitude and the common value of the frequency in inverse directions, so that the product of the two values remains controlled so as to yield a desired exposure level on the traced surface when the beam is on, and the switch is turned on and off at predetermined positions of the spiral path on the surface.

Brief Description of the Drawing

The reader's understanding of practical implementation of preferred embodiments of the invention will be enhanced by reference to the following detailed description taken in conjunction with perusal of the drawing, wherein.

Detailed Description of the Invention

The advantages of vector scanning as compared to raster scanning have been mentioned above. However, even vector scanning can have serious disadvantages. One of the most important ones is the fact that the deflecting system which is used for vector scanning has to be stopped or started very abruptly. Due to the mechanical nature of the deflection systems used in case of lasers and laser beams, the inertia of mirrors at the and laser beams, the inertia of mirrors at the mechanical parts of the deflection system is high enough to prevent the system from working properly. Thus, a number of complicated mechanisms in the form of feedback and other operations must be employed, causing substantial delays awaiting the mirrors and other electromechanical parts to attain the desired values regarding speed and the like.

The present invention overcomes these problems of stopping and starting abruptly by using only gradual changes in the movement of the mirrors and the other mechanical parts. The deflecting system according to the present invention utilizes two mirrors, continuously oscillating in a sinusoidal manner at a common frequency and with a common amplitude, which change gradually from initial values to final values. Although the values of the frequency and amplitude in the case of the two mirrors is the same or common, there is nevertheless a 90 degree phase difference between the sinusoidal motions of the two mirrors.

Figure 1:
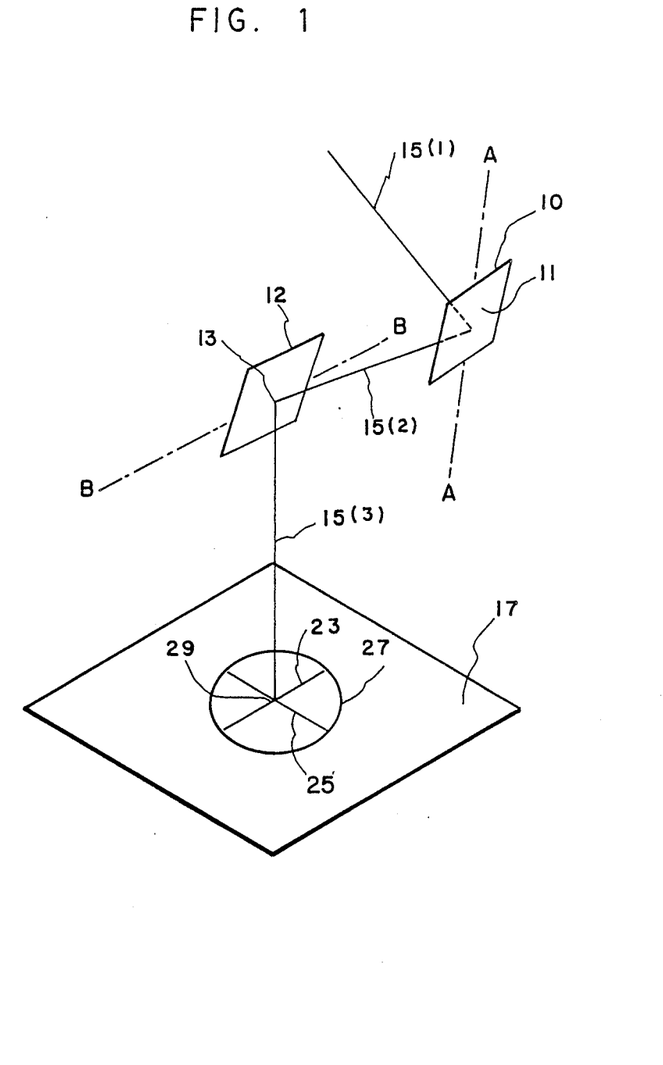
FIG. 1 is a schematic diagram showing the mirror arrangement and a surface to be imaged according to the instant invention.

The deflection system of the instant invention is better illustrated in FIG. 1. It comprises a first mirror 10 having a axis AA, and second mirror 2 having an axis BB. The first mirror 10 oscillates about the first axis AA at a certain frequency and with a certain amplitude. The second mirror 12 also oscillates about its axis BB at the same frequency and at the same amplitude. Although the frequency of both mirrors is the same in value, the oscillation of the first mirror has a difference in phase of 90 degrees from the oscillation of the second mirror. This means that when the instantaneous value of the amplitude of the first mirror passes through a maximum or a minimum, the instantaneous value of the amplitude of the second mirror passes through zero. By the word amplitude is meant the effective amplitude which will be defined and explained below. However, the sinusoidal motions of the two mirrors, despite the 90 degree difference which characterizes them, have a common frequency and a common effective amplitude.

It is preferable that the first axis and the second axis are perpendicular to each other. This means that the projection of the first axis on any plane passing through the second axis is perpendicular to the second axis; also, the projection of the second axis on any plane passing through the first axis is perpendicular to the first axis. Of course, there is one plane in each case containing one of the two axes, where the projection of the other axis is just a point.

Still referring to FIG. 1, the radiation beam 15(1), which is preferably a laser beam is initially deflected by mirror 10 at point 11, and in sequence is deflected by mirror 12 at point 13. Point 11 is preferably contained in both mirror 10 and axis AA, and it is stationary. Point 13, on the other hand, is contained in mirror 12 and it preferably moves only along axis BB. This arrangement provides the smallest possible mirror dimensions for a given beam diameter, and it is extremely important as contributing the least to the system's inertia. It is also important that the mirrors are as light as possible, for the same reason. Beam 15 is deflected by the system towards a surface to be imaged 17. There is a position for each mirror, such that beam 15(2) is deflected to meet the surface 17 at a central point 29. Point 29 is preferably selected to be in the vicinity of the center of gravity of the area to be imaged.

Figure 2:
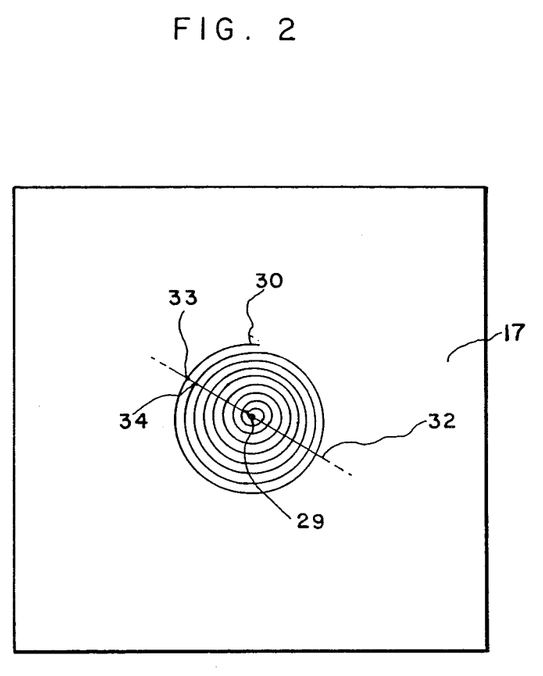
FIG. 2 shows the spiral path of a radiation beam on a surface to be imaged according to the present invention.
Figure 3:
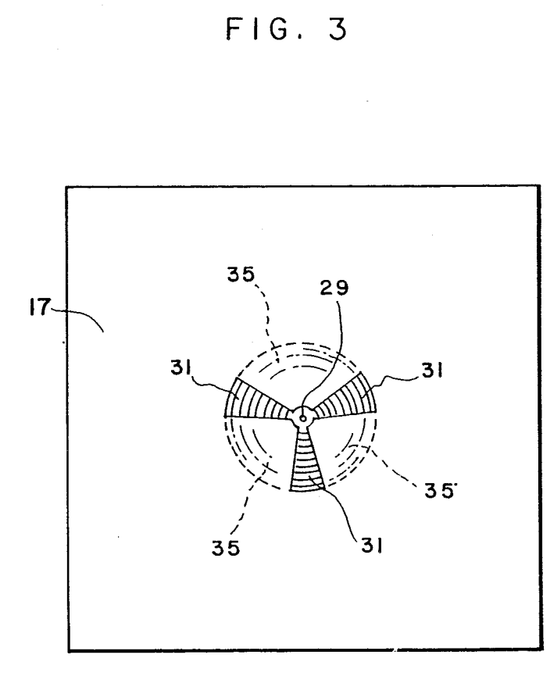
FIG. 3 illustrates a similar spiral path as shown in FIG. 2 with the beam turned on and off at prearranged positions to form a propeller-like image.

Assuming for a moment that mirror 12 is stationary and that mirror 10 is pulsating around its axis AA, a trace 23 of the beam will be produced on surface 17. This trace 23 will be a line segment. Assuming now that mirror 10 is stationary and mirror 12 is pulsating, the trace of beam 15(3) on surface 17 will be line segment 25. Both segments 23 and 25 pass though point 29 on surface 17. The effective amplitude of mirror 10 is defined as line segment 23, while the effective amplitude of mirror 12 is defined as segment 25. According to the instant invention segments 23 and 25 for the amplitudes of mirror 10 and mirror 12 respectively, have substantially the same value. Since radiation beams may differ in diameter or even have different intensity profiles along their diameter, when talking of a trace that a beam produces or a point of incidence, and the like, one refers to the center of the beam rather than the whole cross section of the beam. When both the first mirror 10 and second mirror 12 are pulsating at the same frequency and the same effective amplitude, the trace of beam 15 forms circle 27, as shown in FIG. 1. For this to happen, the sinusoidal motion of the two mirrors has to have substantially the same value with a phase difference of 90 degrees. When the common amplitude value of the two mirrors starts changing from a certain value towards zero or vice versa, then circle 27 of FIG. 1 will become a spiral or a helix 30 on surface 17, as illustrated in FIG. 2. It is important to trace the surface with the beam in spiral path 30 by changing gradually and simultaneously not only the common value of the effective amplitude but also the common value of the frequency in inverse relation thereto, so that the product of the two values remains controlled as to yield a desired constant exposure level on the traced surface when the beam is on. By "inverse relation" is meant that if the common value of the amplitude decreases gradually, the common value of the frequency increases correspondingly, and vice versa. Although fast analog changes in the intensity of a laser beam cannot be achieved with great accuracy, switching of the beam on and off is a rather straightforward matter. Thus, during its helical or spiral path, the beam can be switched rapidly on and off at prearranged positions in order to form an image at predetermined portions of the surface 31, as shown in FIG. 3. Area or surface portion 31, which in the example of FIG. 3 a propeller-like image, has been produced by turning and keeping the beam off within the borders of area or surface portion 35 and turning and maintaining the beam on within the borders of area 31, as the beam follows its spiral path. Although a main purpose of this invention is to maintain substantially constant exposure levels on the exposed areas, it is also possible within certain limits to control the exposure and force it willingly to deviate from being constant by additional gradual changes in either the common frequency or the common effective amplitude or both in order to achieve special results. If for example there is a consistent warpage problem in the part after the part is made, appropriate photocuring differences among the various portions of the part may counteract the warpage and yield a part of better quality. Also, these deviations may be intended to vary controllably the thickness of the individual layers at different portions of the layer, although this is a more difficult task.

If the path 16 (FIG. 4) of beam 15(3) (FIG. 1) starting at point 11, passing through point 13 and ending at point 29, is considerably longer than the maximum dimension of the portion of the surface to be imaged, there are no problems of astigmatism or reflection variations, and the surface having a planar configuration, such as that of surface 17, does not differ considerably, for all practical purposes, from the surface of a sphere having as radius the distance between point 11 and 12 added to distance between point 13 and 29, the sphere being tangent to planar surface 17 at point 29. In such a case the angle of incidence of beam 15 on surface 17 may be considered as constant and equal to substantially 0 degrees. Since the angle of incidence is in this case considered to be constant, there is no need to make any corrections to compensate for the fact that surface 17 is planar and not spherical, and thus maintain the exposure constant.

In general, as the amplitude changes, a number of different corrections have to be incorporated in the changes of common frequency in order to achieve constant exposure at the exposed areas. In the case, however, where the distance between surface 17 and the mirror set (the path of beam 15 starting at point 11, passing through point 13 and ending at point 29), the only requirement for keeping the exposure constant is that the frequency changes simultaneously with the amplitude in a way that the product of the amplitude and the frequency remains substantially constant. Also, the distance between two consecutive paths of the spiral, as shown in FIG. 2, may be kept substantially constant throughout the whole spiral. As shown in FIG. 2, line 32 passing through center 29 intersects the spiral at points 33 and 34. The segment of the line defined by points 33 and 34 is in this case the distance between the two uppermost portions of the spiral. In order to form good scanning images in two dimensional imaging systems, it is known in the art that the optimum scan line spacing between consecutive lines (spirals in this case) to eliminate a visual sense of ripple in the image occurs when the distance between the lines is approximately equal to or less than the $1/e^2$ diameter of the imaging beam which has a gaussian intensity profile. For solid imaging, placement of scan lines or spirals has to be tighter. The reason for this is that the non-gaussian material thickness response to the exposure would not overlap enough to give uniform depth of photocuring into the photocurable composition. For Solid Imaging, the scan spacing is preferably equal to or less than the full width half maximum or $1/e$ 0.693 diameter of the imaging gaussian beam at the imaging plane to minimize the bottom side ripple.

Figure 4:
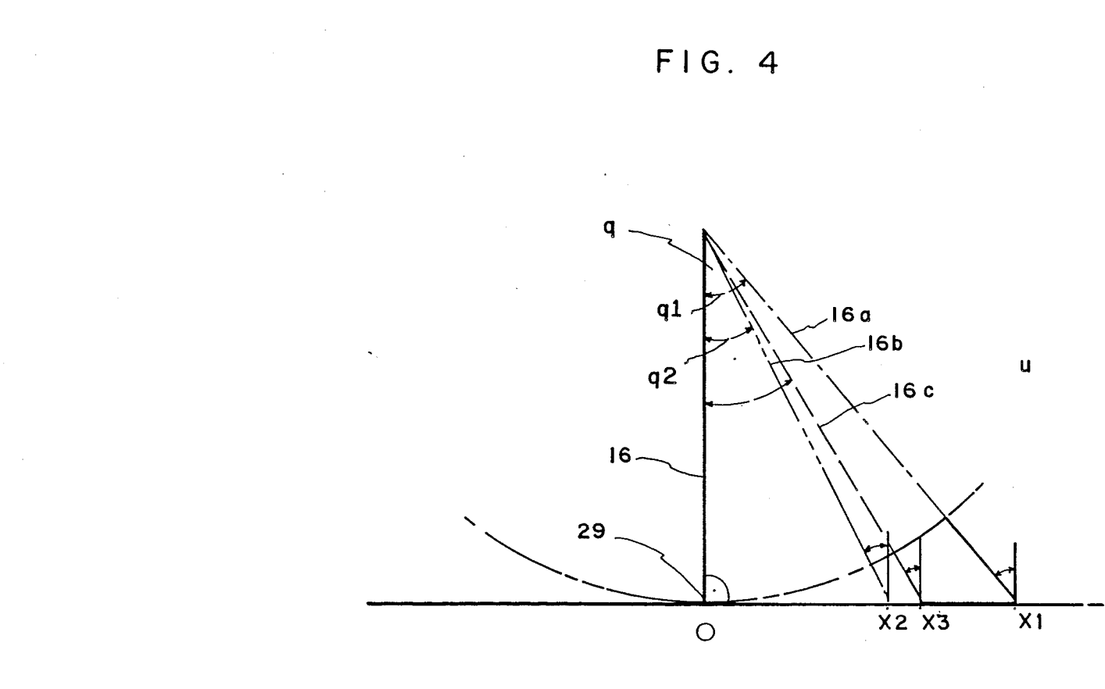
FIG. 4 depicts a way to correct the gradual amplitude decrease when the angle of incidence is substantially different from zero degrees.

In the case where the distance between the set of mirrors 10 and 12, and surface 17 (the path of beam 15 starting at point 11, passing through point 13 and ending at point 29) is comparable to the maximum dimension of the portion of the surface to be imaged, corrections have to be made in order to maintain the exposure constant. The need for a first correction is illustrated in FIG. 4, which represents a cross section of surface 17, the cross section containing line 32 of FIG. 2, and a sphere which is tangent to surface 17 at point 29, the sphere having a radius 16 equal to the length of the beam path from the first mirror to surface 17. Coordinates X1 and X2 represent points 33 and 34 of the spiral of FIG. 2 on surface 17

If one uses angle q, which equals the angle of incidence u (FIG. 4), to control the common effective amplitude and the distance between consecutive paths of the spiral, one can realize that angle q is proportional to the instantaneous common amplitude on surface 17, only when the distance between the set of mirrors and the surface 17 is very large as compared to the maximum dimension of the portion which has to be imaged. In the case where this distance is rather small as shown is FIG. 4, angles q1 and q2 would be proportional to the corresponding arcs on the cross section of sphere 36, the arcs being defined by point 29 and points 1, and 2, respectively. Thus, the spiral would only have a good correlation with angle q, which equals the angle of incidence, if it were formed on the surface of sphere 36. Angle q1, corresponding to the beam in position 16a, and angle q2, corresponding to the same beam in position 16b would define an angle difference which would properly correspond to the arc between points 1 and 2 in FIG. 4. This arc would then correspond to a longer distance such as the distance between points X1 and X2 on the cross section of surface 17. The larger angle q the bigger this difference between the arc on the spherical surface and the line segment on the planar surface. In order to compensate for this difference, the angle at each point has to be corrected, so that the distance between points 1 and 2 on the spherical surface equals the distance between points of consecutive spiral paths on the actual planar surface. Thus, a new angle q3 is calculated, corresponding to beam path 16c and point X3, such that the distance between points X1 and X3 equals the arcuate distance between points 1 and 2. This may be done by simple trigonometric equations well known in the art. This correction may be said to be a common effective amplitude correction.

The second correction has to do with variations in the partial reflection of the beam away from the surface at different angles. The amount of reflected light, also depending on the refractive indices of the environment and the surface to be imaged, may be calculated by relationships well known in the art, such as Snell's law, Fresnel's equations, etc. In general, as the angle of incidence u in FIG. 4 deviates substantially from zero degrees, the amount of reflected radiation increases, and therefore, the effective radiation which penetrates the surface decreases according to the above laws and equations. Thus, a correction can be made to reduce the frequency in proportion to the decrease in radiation due to the deviation from the zero degree incidence, and therefore maintain the exposure constant. Since the angle of incidence will be changing gradually during formation of the spiral, the change in frequency will also be gradual and easy to accomplish in an electromechanical deflection system. This correction may be said to be a common frequency correction. In any event, it is important that the angle of incidence, which equals angle q as shown in FIG. 4, has to be kept smaller than the critical angle, over which substantially the total amount of radiation is reflected away from the surface.

Distance 16 in FIG. 4 may be considered to be large enough not to require the aforementioned corrections in many instances, when the tangent of angle q, or the tangent of the angle of incidence u is smaller than 0.25. If the tangent of the angle of incidence is larger than 0.25, corrections on the common effective amplitude and common frequency are needed in most cases. This value of the tangent of the angle of incidence may vary broadly, however, depending on the application.

Figure 5:
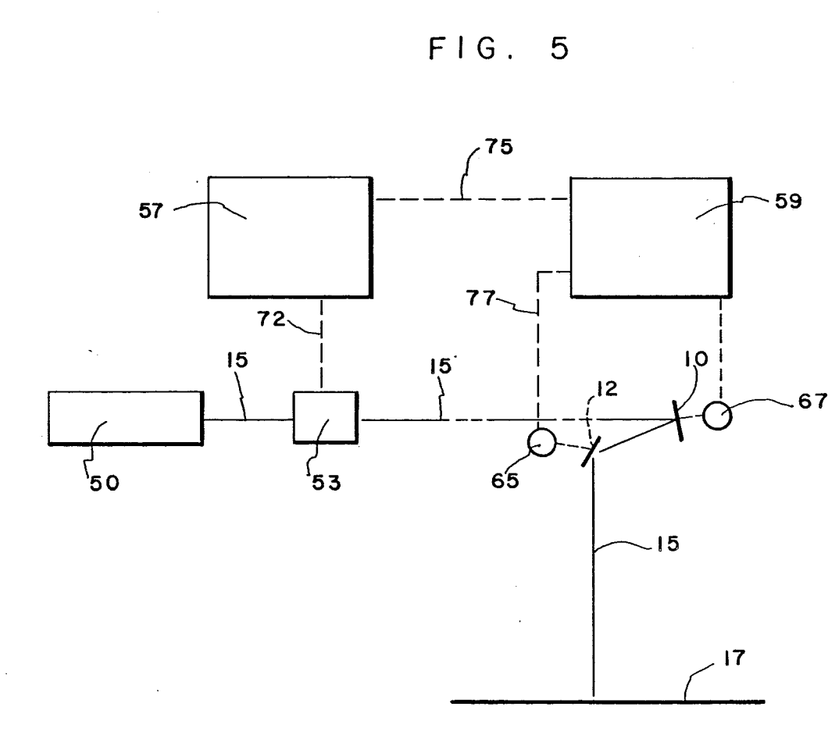
FIG. 5 shows an exemplary block diagram of an apparatus operating according to the present invention.
Figure 6:
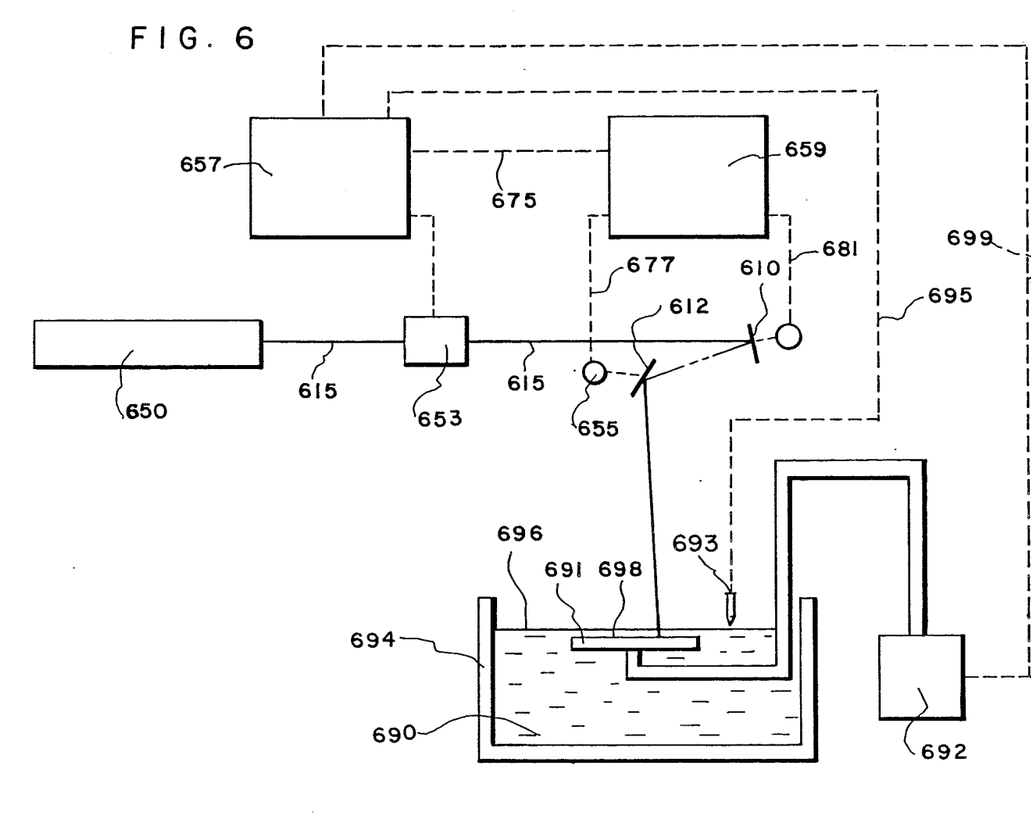
FIG. 6 illustrates another exemplary block diagram of an apparatus according to a preferred embodiment of the instant invention.

An example of an apparatus which implements the teachings of this invention is shown in FIG. 5. The apparatus comprises a radiation source 50, such as a laser which produces a beam 15. Beam 15 passes through an on-off switch, such as an acousto-optical modulator, and then it is deflected by mirrors 10 and 12. Mirrors 10 and 12 are energized through oscillation means, such as servo-motors 67 and 65, respectively. Other types of oscillation means may include resonance devices, where the natural frequency is gradually changeable, by mechanical or electromechanical means, for example. Motors 67 and 65 are energized in turn by frequency generator 59, which is also coupled and controlled by computer 57. The beam 15 is then directed by mirrors 10 and 12 towards surface 17. Feedback and control lines 72, 75, 77 and 81 are used to couple the corresponding parts of the apparatus, as shown in FIG. 6.

As aforementioned, one of the important attributes of this invention is taking advantage of the fact that during the diminishing or increasing sinusoidal motion of the mirrors producing a spiral path of the beam, only gradual changes to the movement of the mechanical parts are necessary, and they may be easily manipulated in order to maintain desired exposure. In addition, the fact that when the effective amplitude increases, the frequency decreases accordingly, helps significantly with regard to problem of fighting inertia.

In operation, radiation source 50, preferably a laser, produces a beam 15 which passes through on-off switch 53. In sequence beam 15 is deflected through mirrors 10 and 12 towards surface 17, in order to image the selected portions of the surface. Computer 57, containing graphic data corresponding to the on-off positions of the image to be formed on surface 17, controls switch 53 through line 72, and turns the same on and off at the appropriate positions of the beam path on the surface to be imaged. Through line 75, computer 57 also controls and gives commands to frequency generator 59, which in turn produces the appropriate signals fed to mirror control motor 65 through line 77 and to motor 67 through line 81, the only difference between the two signals being that they are out of phase by substantially 90 degrees. Computer 57 commands generator 59 to have the common effective amplitude and the common frequency changed gradually in opposite directions in order to produce desired exposure at the exposed areas of surface 17 after all corrections, if any, have been made and processed by computer 57. In the simplest case, where the distance between the set of mirrors and the surface to be imaged is very long as compared to the maximum dimension of the imaged portion, no additional corrections are needed as discussed before, except that the product of the common frequency and the common amplitude is kept constant as gradual changes in amplitude and frequency occur in opposite relations during the formation of a spiral. On the other hand, when the distance between the set of mirrors and the surface to be imaged is comparable to the maximum dimension of the imaged portion, additional corrections to the common effective amplitude and to the frequency as aforementioned are incorporated into the data processing calculations of computer 57 by techniques well known in the art. It is only important that all changes in amplitude and frequency, with or without additional corrections are gradual, except of course for their initial and final values during starting or ending the operation, at which point abrupt changes may take place necessarily, preferably with the beam turned off.

The most preferred type of switch is acousto-optical. Examples of other switches that may be used are:

Electro-optic, which are based on a crystal that changes optical polarity when voltages are applied; liquid crystal gates, such the one that can be used in the visible region, made by Meadowlark Optics (7460 East County Line Road, Longmont, Colo. 80501) called a Beam Gate. It too is based on a change in polarization of the liquid crystal material;

Piezoelectric cells, which may move diaphragms, such as a small pinhole; the so called PLZT (Pb 0.9, La 0.1, Zr 0.65, Ti 0.35) based switches, which rely on polarization. Two polarizing plates are placed with their axes 90 degrees to one another, and with a PLZT ferroelectric crystal inserted thereinbetween. The PLZT crystal is capable of rotating the polarity of light passing through depending on whether there is an electrical field applied to the PLZT or not. So now in the off position (PLZT has no electric field), light passing through the first polarizer is unchanged through the PLZT and is blocked by the second polarizer. But when the PLZT is under the electric field, light passing through the first polarizer is rotated by the PLZT and is capable of passing through the second polarizer.

The surface to be imaged may be any surface, at least one property of which, chemical or physical, changes in the regions subjected to the radiation. These regions may also be called imaged areas. Examples are black and white or color photographic surfaces based on silver halide or other chemistries, xerographic surfaces, magnetic surfaces, ablating or fugitive surfaces, deforming surfaces, liquid crystal surfaces, photopolymer surfaces, and the like. Although under the strict definition of the word "surface" is meant the interface between two different substances or between one substance and vacuum, the interface having infinitesimal thickness, the definition of "surface" for the purposes of the instant invention includes layers of finite thickness. Thus, a coating of a photoresist, or a layer of photocurable composition, or a film of a compound being fugitive upon irradiation, are considered as surfaces in the context of the present invention. The preferred radiation is light, including ultraviolet (UV), visible, and infrared (IR) light. From these three wavelength regions of light, ultraviolet is the most preferred.

In a preferred embodiment of this invention, as aforementioned, more than one surface is subjected to the constant exposure radiation beam in consecutive layers of a photocurable composition in order to form a solid object. Use of liquid photocurable compositions is preferred.

The manner of introducing successive layers of photocurable liquid and exposing to radiation such as a laser will generally be by two methods, or a combination thereof. In a first method a pool of liquid is present in a vessel and it is not necessary to introduce additional photocurable liquid. In such case a movable table or floor supports the liquid. Initially the table or floor is elevated with a portion of the photocurable liquid present above the table or floor and a portion of the liquid present in the vessel around the edge of the table or floor and/or underneath it. (Illustratively a table is present which allows liquid to flow underneath the table as it is used.) After exposure and photocuring of a portion of the liquid layer above the table, the table is lowered to allow another layer of photocurable liquid to flow on top of the previous layer followed by exposure of predetermined area on the newly applied liquid layer. If necessary due to the shape of the final three-dimensional article the thickness of more than one liquid layer can be photocured. This procedure of table or floor lowering and exposure continues until formation of the desired three-dimensional article occurs.

In a second method a movable table or floor need not be employed but rather a new quantity of photocurable liquid is introduced into a vessel after an exposure step in formation of a new liquid layer on a previously exposed layer containing both photocured liquid photocurable material. The manner of liquid introduction is not critical; the important thing is to have an ability to photocure successive liquid layers.

In FIG. 6, a movable table 691 is initially positioned within the liquid photocurable composition 690, a short predetermined distance from the surface 696, providing a thin layer 698 between surface 696 and the table 691. The positioning of table 691 is provided by the placement means 692, which in turn is controlled by computer means 657 according to the data stored therein, through line 699. When the first layer of the rigid object is complete, the movable table 691 is lowered by a small predetermined distance by the placement means 692 through a command from computer means 657. Following a similar command from computer means 657, layer forming means, such as doctor knife 693, sweeps the surface 696 for leveling purposes. The same procedure is then followed for producing the second, third, and the following layers until the rigid object is completed.

The formulation of the photocurable compositions for solid imaging purposes is very important in order to receive the desirable effects and characteristics, regardless of type of scanning. A photocurable composition for solid imaging should contain at least one photocurable monomer or oligomer and at least one photoinitiator. For the purposes of this invention, the words monomer and oligomer have substantially the same meaning and they may be used interchangeably.

Examples of suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and di methacrylate, hexamethylene glycol·diacrylate and dimethacrylate, 1,3-propanediol diacrylate and dimethacrylate, decamethylene glycol diacrylate and dimethacrylate, 1,4-cyclohexane diol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di(p-hydroxyphenyl)propane dimethacrylate, di-(3-methacryloxy-2-hydroxy propyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No.

2,927,022, e.g., those having a plurality of addition polymerizable ethylenic linkages particularly when present as terminal linkages. Particularly preferred monomers are ethoxylated trimethylolpropane triacrylate, ethylated pentaerythritol triacrylate, dipentaerythritol monohydroxypentaacrylate 1,10-decanediol dimethylacrylate, di-(3-acryloxy-2-hydroxypropyl) ether of bisphenol A oligomers, di-(3-methacryloxy-2-hydroxyl alkyl) ether of bisphenol A oligomers, urethane diacrylates and methacrylates and oligomers thereof, caprolactone acrylates and methacrylates, propoxylated neopentyl glycol diacrylate and methacrylate, and mixtures thereof.

Examples of photoinitiators which are useful in the present invention alone or in combination are described in U.S. Pat. No. 2,760,863 and include vicinal ketaldonyl alcohols such as benzoin, pivaloin, acyloin ethers, e.g., benzoin methyl and ethyl ethers, benzil dimethyl ketal; a-hydrocarbon-substituted aromatic acyloins, including a-methylbenzoin a-allylbenzoin, a-phenylbenzoin, 1-hydroxylcyclohexyl phenol ketone, diethoxyphenyl acetophenone, 2-methyl-1-[4-(methylthio)-phenyl]-2-morpholino-propanone-1. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, acryloxy benzophenone, 2,4,5-triphenylimidazolyl dimers with hydrogen donors including leuco dyes and mixtures thereof as described in U.S. Pat. Nos. 3,427,161, 3,479,185 and 3,549,367 can be used as initiators. Also useful with photoinitiators and photoinhibitors are sensitizers disclosed in U.S. Pat No. 4,162,162. The photoinitiator system is present in 0.05 to 10% by weight based on the total weight of the photocurable composition. Other suitable photoinitiation systems which are thermally inactive but which generate free radicals upon exposure to light at or below 185° C. include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tertbutylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethylanthraquinone, 2,3-dimethylanthraquinone, 2-phenylanthraquinone, 2,3-diphenyl-anthraquinone, retenequinone, 7,8,9,10-tetrahydronaphthacene-5,12-dione, and 1,2,3,4-tetrahydrobenz(a)anthracene-7,12-dione; also, alpha amino aromatic ketones, halogenated compounds like trichloro-methyl substituted cyclohexadienones and triazines or chlorinated acetophenone derivatives, thioxanthones in presence of tertiary amines, and titanocenes.

Although the preferred mechanism of photocuring is free radical polymerization, other mechanisms of photocuring apply also within the realm of this invention. Such other mechanisms include but are not limited to cationic polymerization, anionic polymerization, condensation polymerization, addition polymerization, and the like.

Other components may also be present in the photocurable compositions, e.g., pigments, dyes, extenders, thermal inhibitors, interlayer and generally interfacial adhesion promoters, such as organosilane coupling agents, dispersants, surfactants, plasticizers, coating aids such as polyethylene oxides, etc. so long as the photocurable compositions retain their essential properties.

Although the invention has been described in accordance with preferred embodiments thereof, it is not limited thereby and should be understood to be defined by the scope of the appended claims.

What is claimed is:

1. A method for subjecting predetermined portions of a surface to desired exposure levels with a beam of radiation, comprising the steps of:
    deflecting said beam towards said surface through a set of a first mirror and a second mirror, the first mirror having a first rotational axis, the second mirror having a second rotational axis;
    oscillating said first mirror about said first axis at a desired frequency and effective amplitude with a substantially sinusoidal motion, and oscillating said second mirror about said second axis with a substantially sinusoidal motion at substantially said desired frequency and effective amplitude as employed for said first mirror, so that both mirrors are characterized by a common frequency value and a common effective amplitude value;
    maintaining a substantially 90 degree phase difference between the sinusoidal motion of the first mirror and the sinusoidal motion of the second mirror;
    tracing said surface with said beam in a spiral path by changing gradually and simultaneously the common value of the effective amplitude and the common value of the frequency inversely, so that the product of the two values is controlled so as to yield a desired exposure level on the traced surface when the beam is on; and
    turning the beam off and on at predetermined angular positions in order to subject said predetermined portions of said surface located within the prearranged positions to a desired exposure level.

2. The method of claim 1 wherein said desired exposure is a constant exposure level.

3. The method of claim 1 wherein said first axis is perpendicular to said second axis.

4. The method of claim 1, wherein the product of the common value of frequency and the common value of effective amplitude is kept constant for maintaining substantially constant exposure.

5. The method of claim 4, wherein an additional step of common effective amplitude correction is superimposed for maintaining substantially constant exposure.

6. The method of claim 5, wherein a step of common frequency correction is superimposed for maintaining substantially constant exposure.

7. The method of claim 1, wherein the beam of radiation is a laser beam.

8. The method of claim 1, wherein the surface comprises a photographic constituent.

9. The method of claim 1, wherein the surface comprises a liquid crystal constituent.

10. The method of claim 1, wherein the surface comprises a xerographic constituent.

11. The method of claim 1, wherein the surface comprises a magnetic constituent.

12. The method of claim 1, wherein the surface comprises an ablating constituent.

13. The method of claim 1, wherein the surface comprises a deforming constituent.

14. The method of claim 1, wherein the surface comprises a photopolymer constituent.

15. The method of claim 1, wherein the surface is a photocurable composition, and further comprising the following steps in order to fabricate an integral three dimensional object from successive layers of the photocurable composition;

(a) forming a layer of the photocurable composition;

(b) photocuring at least a portion of the layer of the photocurable composition by exposure to the radiation beam;

(c) introducing a new layer of photocurable composition on the layer previously exposed to the radiation beam;

(d) photocuring at least a portion of the new layer by exposure to the radiation beam; and (e) repeating steps (c) and (d) until a desired integral three dimensional object is fabricated.

* * * * *